United States Patent [19]
Brooks et al.

[11] Patent Number: 5,239,481
[45] Date of Patent: Aug. 24, 1993

[54] METHOD FOR MEASURING PULSE DISTORTION

[75] Inventors: Thomas W. Brooks, Underhill; Paul T. Gutwin, Williston, both of Vt.; Caryn G. Melrose, San Jose; Frank A. Nemec, Jr., Saratoga, both of Calif.; James J. Tomczak, Burlington, Vt.

[73] Assignee: International Business Machines Corporation, Armonk, N.Y.

[21] Appl. No.: 752,394

[22] Filed: Aug. 30, 1991

[51] Int. Cl.$^5$ ............................................. G01R 15/60
[52] U.S. Cl. ..................................... 364/486; 364/578; 364/488; 364/489; 364/554
[58] Field of Search ................ 364/378, 488, 489, 486, 364/554, 553; 324/620–626; 371/23

[56] References Cited

U.S. PATENT DOCUMENTS

| | | | |
|---|---|---|---|
| 3,790,767 | 2/1974 | Alexander | 364/486 |
| 4,264,859 | 4/1981 | Blaess | 364/553 |
| 4,855,930 | 8/1989 | Chao et al. | 364/554 |
| 4,924,430 | 5/1990 | Zasio et al. | 364/488 |
| 5,047,971 | 9/1991 | Horwitz | 364/578 |

FOREIGN PATENT DOCUMENTS 0029865  2/1985  Japan .................................. 364/578

OTHER PUBLICATIONS

J. Tomczak et al. Pulse-Width Degradation in Digital Circuits Jun. 1989, pp. 26.6.1–26.6.4 IEEE Publication.
P. Argade Sizing an Inverter with a Precise Delay:Generation of Complementary Signals with Minimal Skew and Pulsewidth Distortion in CMOS Jan. 1989 pp. 33–40.
W. Elder et al. Timing Verification for Macros with Usage Dependent Constraints IBM Technical Disclosure Bulletin Aug. 1989 pp. 355–358.
C. Bond et al. Timing Verification of Algorithmically Grown Macros IBM Technical Disclosure Bulletin, Aug. 1991, pp. 260–262.

*Primary Examiner*—Jack B. Harvey
*Assistant Examiner*—Hal D. Wachsman
*Attorney, Agent, or Firm*—David J. Kappos

[57] ABSTRACT

A method for measuring pulse distortion in a digital logic design. A digital logic block of interest is divided into its component primary logic functions. The pulse width distortion characteristics are determined for each primary logic function. The pulse width distortion characteristics are used to develop values representing the minimum pulse width required to guarantee full pulse amplitude propagation through each primary logic function. Thus, pulse distortion is characterized in terms of both width and amplitude components. Pulse width distortion for the entire logic block is then determined by following each logic path through the logic block and statistically summing the pulse width distortion characteristics for each occurrence of each primary logic function in the logic path. Pulse amplitude integrity is checked at the input to each primary logic function by referencing the pre-calculated values for minimum pulse width required to guarantee full pulse amplitude propagation through the primary logic function.

16 Claims, 8 Drawing Sheets

CMOS INVERTER

TIMING DIAGRAM FOR CMOS INVERTOR

NON-INVERTING CIRCUIT CHAIN

INVERTING CIRCUIT CHAIN

MINIMUM INPUT PULSE WIDTH FOR R-T-R OUTPUT

| | | Distortion, ns | | | Min. Pos. Pulse, ns | | | Min. Neg. Pulse, ns | | |
|---|---|---|---|---|---|---|---|---|---|---|
| Cl | Tr/Tf | Min | Nom | Max | Min | Nom | Max | Min | Nom | Max |
| 0.1 | 0.5 | −0.276 | −0.173 | −0.083 | 1.234 | 1.260 | 1.853 | 1.023 | 1.034 | 1.449 |
| 0.1 | 1.0 | −.0272 | −0.207 | −0.042 | 1.544 | 1.599 | 2.190 | 1.345 | 1.378 | 1.793 |
| 0.1 | 1.5 | −0.287 | −0.247 | −0.002 | 1.843 | 1.941 | 2.533 | 1.649 | 1.727 | 2.129 |
| 0.1 | 2.0 | −0.307 | −0.297 | −0.040 | 2.139 | 2.281 | 2.880 | 1.945 | 2.064 | 2.444 |
| 0.25 | 0.5 | −0.278 | −0.172 | −0.095 | 1.560 | 1.583 | 2.252 | 1.268 | 1.299 | 1.821 |
| 0.25 | 1.0 | −0.276 | −0.205 | −0.054 | 1.892 | 1.898 | 2.588 | 1.607 | 1.620 | 2.161 |
| 0.25 | 1.5 | −0.289 | −0.247 | −0.012 | 2.191 | 2.239 | 2.928 | 1.902 | 1.962 | 2.491 |
| 0.25 | 2.0 | −0.313 | −0.295 | −0.030 | 2.479 | 2.571 | 3.276 | 2.195 | 2.815 | 2.304 |
| 0.50 | 0.5 | −0.284 | −0.168 | −0.121 | 2.087 | 2.192 | 2.937 | 1.688 | 1.768 | 2.435 |
| 0.50 | 1.0 | −0.279 | −0.202 | −0.081 | 2.426 | 2.496 | 3.272 | 2.035 | 2.070 | 2.775 |
| 0.50 | 1.5 | −0.291 | −0.245 | −0.039 | 2.762 | 2.796 | 3.611 | 2.381 | 2.396 | 3.109 |
| 0.50 | 2.0 | −0.317 | −0.294 | −0.004 | 3.088 | 3.096 | 3.953 | 2.649 | 2.715 | 3.424 |
| 0.75 | 0.5 | −0.285 | −0.165 | −0.156 | 2.265 | 2.805 | 3.625 | 2.099 | 2.240 | 3.040 |
| 0.75 | 1.0 | −0.283 | −0.196 | −0.113 | 2.960 | 3.111 | 3.962 | 2.451 | 2.550 | 3.374 |
| 0.75 | 1.5 | −0.291 | −0.240 | −0.071 | 3.295 | 3.416 | 4.300 | 2.791 | 2.837 | 3.713 |
| 0.75 | 2.0 | −0.315 | −0.289 | −0.031 | 3.628 | 3.702 | 4.643 | 3.125 | 3.127 | 4.030 |
| 1.00 | 0.5 | −0.286 | −0.163 | −0.191 | 3.165 | 3.424 | 4.314 | 2.508 | 2.716 | 3.643 |
| 1.00 | 1.0 | −0.285 | −0.193 | −0.150 | 3.502 | 3.730 | 4.646 | 2.858 | 3.021 | 3.979 |
| 1.00 | 1.5 | −0.293 | −0.237 | −0.108 | 3.836 | 4.030 | 4.985 | 3.196 | 3.313 | 4.313 |
| 1.00 | 2.0 | −0.320 | −0.287 | −0.064 | 4.170 | 4.315 | 5.330 | 3.532 | 3.595 | 4.625 |
| 1.25 | 0.5 | −0.292 | −0.163 | −0.230 | 3.712 | 4.038 | 5.004 | 2.915 | 3.187 | 4.234 |
| 1.25 | 1.0 | −0.288 | −0.193 | −0.188 | 4.045 | 4.340 | 5.344 | 3.261 | 3.490 | 4.579 |
| 1.25 | 1.5 | −0.297 | −0.236 | −0.146 | 4.379 | 4.637 | 5.682 | 3.609 | 3.789 | 4.907 |
| 1.25 | 2.0 | −0.322 | −0.286 | −0.102 | 4.710 | 4.937 | 6.021 | 3.938 | 4.070 | 5.224 |

DISTORTION TABLE EXAMPLE

FIG. 5

MINIMUM PULSES REQUIRED TO GUARANTEE RAIL-TO-RAIL OUTPUT

PULSE DISTORTION EXAMPLES

PATH CONSISTING OF PRIMARY LOGIC FUNCTIONS B1 AND B2

LOGIC BLOCK CONTAINING MULTIPLE LOGIC PATHS

METHOD FOR MEASURING PULSE DISTORTION

This invention relates in general to digital logic design tools for use in computer simulation of logic circuits and in particular to analysis of pulse width and pulse amplitude characteristics of data pulses propagated through digital logic circuits.

BACKGROUND OF THE INVENTION

Full performance utilization of an electronic circuit technology requires circuit operation at the highest possible operating frequency. An increase in the operating frequency of a logic circuit translates to a decrease in both the data and clock periods and thus a decrease in the width of the data and clock pulses.

Pulse distortion is defined as the shrinkage or expansion of pulse width and amplitude as electronic signals (pulses) propagate through circuits; it is always present independent of the operating frequency or technology used. As the operating frequency increases to accommodate higher performance requirements, pulse distortion becomes noticeable because the distortion becomes a significant percentage of the pulse width. As the operating frequency increases still further, the effect of pulse distortion becomes so severe that the pulse width and amplitude shrink to a point where erroneous data is clocked. Finally, at still higher frequencies pulse propagation ceases altogether.

To achieve high-speed performance in an electronic circuit design, the highest reliable operating frequency must be determined. The pulse distortion characteristics of the logic and the delay through the circuits govern this frequency. According to the prior art, one technique for determining the highest reliable operating frequency as a function of pulse distortion involves simply implementing the minimum pulse width specifications for the particular technology (e.g., CMOS, Bipolar) in which the design is to be constructed. These specifications, which are made available by circuit fabrication vendors, represent conservative generalized guidelines which limit pulse width to a specific minimum value in order to guarantee correct propagation for all possible conditions and any design using the technology. These specifications are directed to "correct by construction" standard logic block or gate array design systems for implementing VLSI circuits quickly and easily, but sacrifice circuit performance and density to ensure that designs are fail-safe. Such guidelines limit the operating frequency well below the technology limit.

Another prior art technique, which deals more directly with maximizing performance by determining pulse distortion characteristics for a circuit design, is to subject the design to rigorous simulation using one of the numerous commercially available analog circuit simulation tools running on a digital computer. This approach provides the most accurate method for calculating pulse distortion, but suffers the drawback of being very computation intensive. Thus the computation time required to analyze a logic block or a complete VLSI chip according to this approach is prohibitive.

A third prior art technique for dealing with pulse distortion centers around determining the arrival time of "edges" (transitions between high and low logical signal values) in an electronic circuit by way of statistical calculations performed on a digital computer. A general problem with this approach is that it characterizes pulse distortion in terms of pulse width only, as opposed to both pulse width and amplitude. More particularly, the calculations, which are based on timing analysis theory, lead to inaccurate pulse width characterizations, because the latest leading edge and the earliest trailing edge are chosen to define the pulse width. In fact, these edges are not logically related, and do not form a logic "pulse." Finally, this approach relies on data that focuses on best and worst case delay times, rather than on pulse width distortion. Best/worst case delay data can yield unjustifiably optimistic pulse width distortion estimates.

In summary, the prior art methods for determining pulse distortion are inadequate when applied to logic blocks or whole VLSI circuit designs, either because their computation cost is prohibitive, or because they are able to characterize pulse distortion in terms of pulse width only and produce results which are not accurate enough to be useful.

OBJECTS OF THE INVENTION

It is therefore an object of the present invention to provide a time efficient and accurate method for measuring pulse distortion in an electronic circuit design containing many circuits.

It is another object of the present invention to provide a method for measuring pulse distortion in an electronic circuit design by statistically summing the pulse distortion characteristics of the individual circuits which form the circuit design.

It is another object of the present invention to provide a method for determining pulse amplitude integrity in an electronic circuit design.

These and other objects will become more apparent when read in light of the following specification and drawings.

SUMMARY OF THE INVENTION

In accordance with the invention, a method for using a computer is provided which quickly and accurately measures pulse distortion of a digital logic design consisting of a few circuits or an entire VLSI chip. The method, hereinafter referred to as a digital logic design tool (tool), characterizes pulse distortion in terms of both width and amplitude components. It can be used to determine the highest clock frequency for a given set of design parameters, or to adjust pulse distortion at selected points in the logic design by varying parameters and thereby achieve the highest possible clock frequency for the design.

The computer-implemented method of the invention first divides the logic block of interest into its component primary logic functions (AND, OR, NOT gates, etc.). The pulse width distortion characteristics for each primary logic function are determined, using a known analog circuit simulation tool, as a function of design parameters (e.g., capacitive loading, input rise time, input fall time), environmental parameters (e.g., temperature, supply voltage), and process parameters (e.g., carrier mobility, effective channel length, threshold voltage). The circuit process parameters themselves are represented to the circuit simulation tool as statistical distributions. The design parameters and environmental parameters are varied successively to create a matrix of pulse width distortion values, which are stored in computer memory. The values representing pulse width distortion characteristics are used to develop minimum pulse width values required to guarantee full pulse amplitude propagation through the primary logic function. The pulse width distortion values and minimum pulse width values are assembled into tables, one for each primary logic function. The tables are created and stored in computer memory.

Further according to the method of the present invention, once the pulse distortion characteristics are known for all primary logic functions in the logic block, the logic block is divided into logic paths. A design pulse is applied to each successive logic path, and the pulse width distortion through the logic path is determined by statistically summing the pulse width distortion characteristics for each occurrence of each primary logic function in the logic path. As the design pulse is propagated through the logic path, it is checked for pulse amplitude integrity at the input to each primary logic function by comparing its propagated state (width) with the values for minimum pulse width required to guarantee full pulse amplitude propagation through the primary logic function.

In addition to its usefulness in analyzing distortion characteristics for a given set of design, process, and environmental parameters, the invention can further be applied to adjusting the pulse distortion of a logic block by varying parameters such as primary logic function, net wire loading, and fanout. By successive program iterations, the effect of these parameters on pulse distortion can be observed, and the logic block can be tuned to achieve the highest possible performance.

BRIEF DESCRIPTION OF THE DRAWINGS

FIG. 1b is a timing diagram illustrating the input and output pulses for the inverter of FIG. 1a.

FIG. 5 is a table illustrating the organization of pulse distortion data for a typical primary logic function.

I. CHARACTERIZATION OF PULSE WIDTH DISTORTION AND PULSE AMPLITUDE DEGRADATION

In order to appreciate the specific aspects of the invention as applied to characterizing pulse distortion, it is necessary to identify the dominant factors contributing to pulse width distortion and pulse amplitude degradation in electronic circuits. For this purpose, the exemplary logic shown in FIGS. 1, 2, 3 and 4 will be examined.

A. Nomenclature

Several variables will be referred to throughout this section. Their identifying symbols and meanings are given below.

$C_l$ Load Capacitance (pF)
$K_{ox}$ Relative permittivity of silicon dioxide (3.9)
$L_p, L_n$ Gate channel length in p- and n-channel transistors (μm)
$t_{ox}$ Gate oxide thickness (Å)
$V_{tn}, V_{tp}$ Threshold voltage in p- and n-channel transistors (V)
$W_p, W_n$ Gate channel width in p- and n-channel transistors (μm)
$\epsilon_0$ Permittivity of free space ($8.854 \times 10^{-14}$ F/cm)
$U_p, U_n$ Mobility of minority carriers in p- and n-channel transistors (cm²/V-sec)

B. Pulse-Width Distortion for an Inverter

Figure 1A:
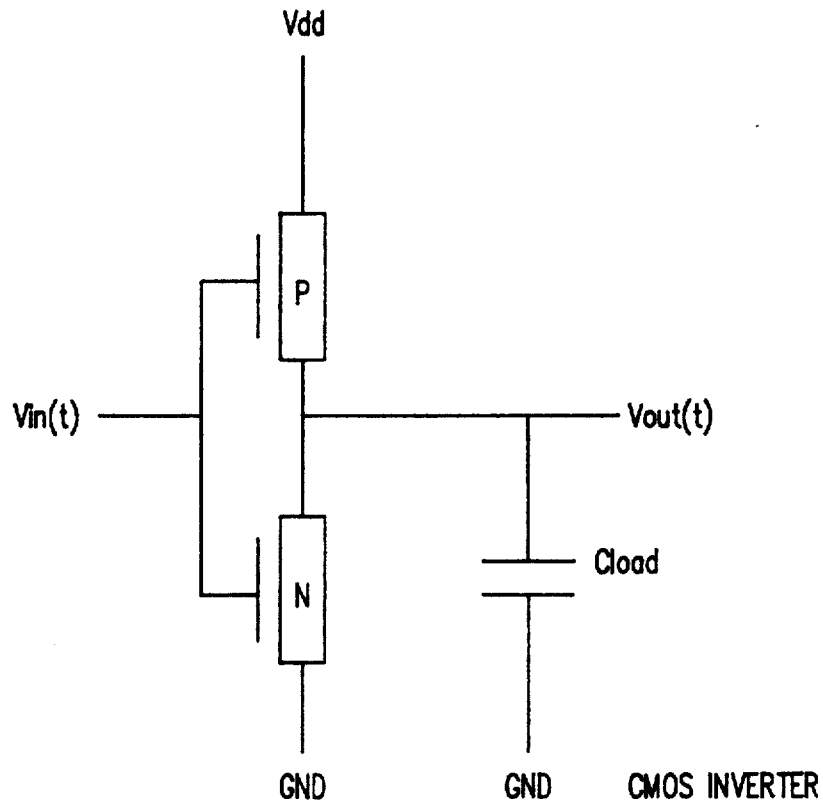
FIG. 1a is a schematic diagram illustrating a CMOS inverter.
Figure 1B:
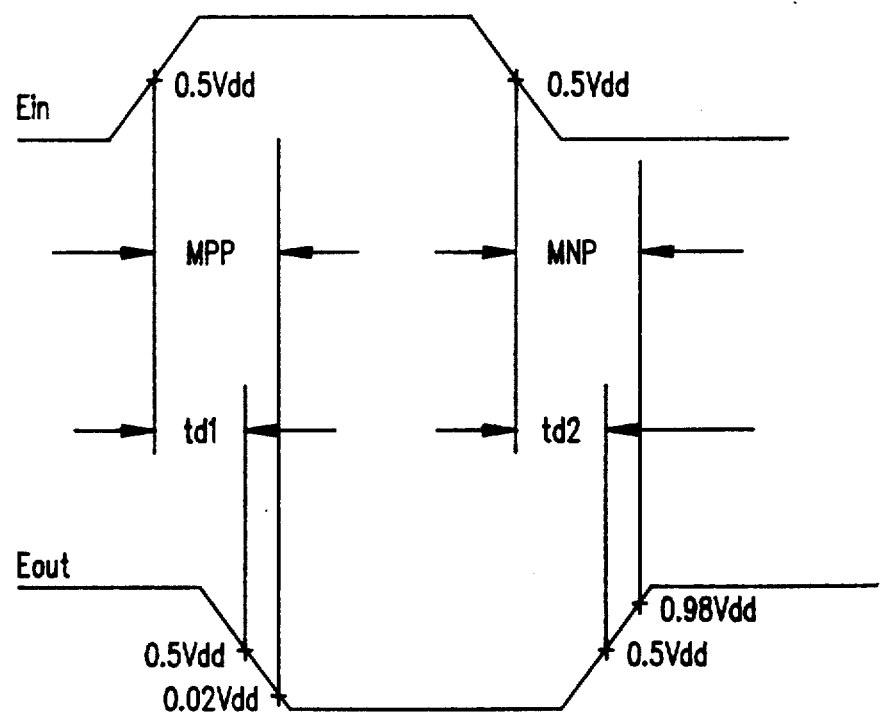

FIG. 1a illustrates a CMOS inverter; FIG. 1b illustrates its input and output pulse relationship. With reference to these figures the following analysis will derive the design parameter, environmental parameter, and circuit process parameter interactions contributing to pulse distortion for such a circuit.

The falling delay $T_n$ from 50% of the input pulse to 50% of the output pulse is $$T_n = \frac{2C_l t_{ox} L_n}{K_{ox}\epsilon_0 U_n W_n}\left[\frac{V_{tn}}{(V_{dd} - V_{tn})^2} + \frac{1}{2(V_{dd} - V_{tn})} \ln \frac{1.5V_{dd} - 2V_{tn}}{0.5V_{dd}}\right]. \quad (1)$$

The rising delay has the same form with the subscript (n) replaced by the subscript (p). For $V_t = K_0 V_{dd}$, the term in brackets can be rewritten as $$f(K_0) = \frac{1}{V_{dd}}\left[\frac{K_0}{(1-K_0)^2} + \frac{1}{2(1-K_0)} \ln \frac{1.5-2K_0}{0.5}\right]. \quad (2)$$

The variation in $f(K_0)$ is about ±4% for $0.9 \text{ V} < V_{t}$. $0 < 1.1$ V and $V_{dd} = 5$ V. The pulse width distortion (PWD) can be expressed as $$PWD = t_{d1} - t_{d2} = T_n - T_p. \quad (3)$$

Combining (1), (2) and (3) and solving for PWD:

$$PWD = \frac{2C_l t_{ox} f(K_0)}{K_{ox}\epsilon_0}\left[\frac{L_n}{W_n U_n} - \frac{L_p}{W_p U_p}\right]. \quad (4)$$

To minimize the pulse width distortion the term in brackets can initially be set to zero by design. For nominal values, if $L_{n0} = L_{p0}$ and $$\frac{W_p}{W_n} = \frac{U_{n0}}{U_{p0}} = \xi$$

then $$PWD = \frac{2C_l t_{ox} f(K_0)}{K_{ox}\epsilon_0 W_n}\left[\frac{L_n}{U_n} - \frac{L_p}{\xi U_p}\right]. \quad (5)$$

The dependence of PWD on design, environmental, and circuit process parameters is shown in equation (5). Temperature does not appear in (5) because it has a second order influence on PWD; however, its overall effect is important, since any increase in temperature causes a decrease in both Vt and $U_n$ and $U_p$. The parameter relationships that simultaneously increase $t_{d1}$ and decrease $t_{d2}$, or decrease $t_{d1}$ and increase $t_{d2}$, maximize PWD. The distortion can be positive or negative depending on the value of $(L_n \div U_n) - (L_p \div \zeta U_p)$. This quantity is then multiplied by the remaining parameters that either increase or decrease the pulse width distortion. Thus, the dominant factors contributing to pulse width distortion in CMOS circuits can be summarized as:

1. The inherent circuit imbalance with all device parameters at nominal (in the present inverter example this imbalance was designed out nominally by setting $W_p \div W_n = \zeta$);
2. Circuit process parameter imbalance from device to device due to imperfect tracking on chip for $U_n$, $U_p$, $L_n$, $L_p$, $V_{tn}$, and $V_{tp}$;
3. Variations in environmental parameters $t_{ox}$, $V_{dd}$, and temperature;
4. Design parameters $C_l$ and $T_n$, $T_p$.

C. Pulse-Width Distortion of a Circuit Chain

Figure 2:
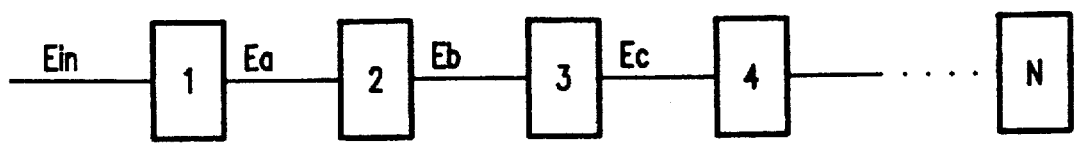
FIG. 2 is a block and timing diagram illustrating a non-inverting circuit chain and its pulse width distortion characteristics.
Figure 2:
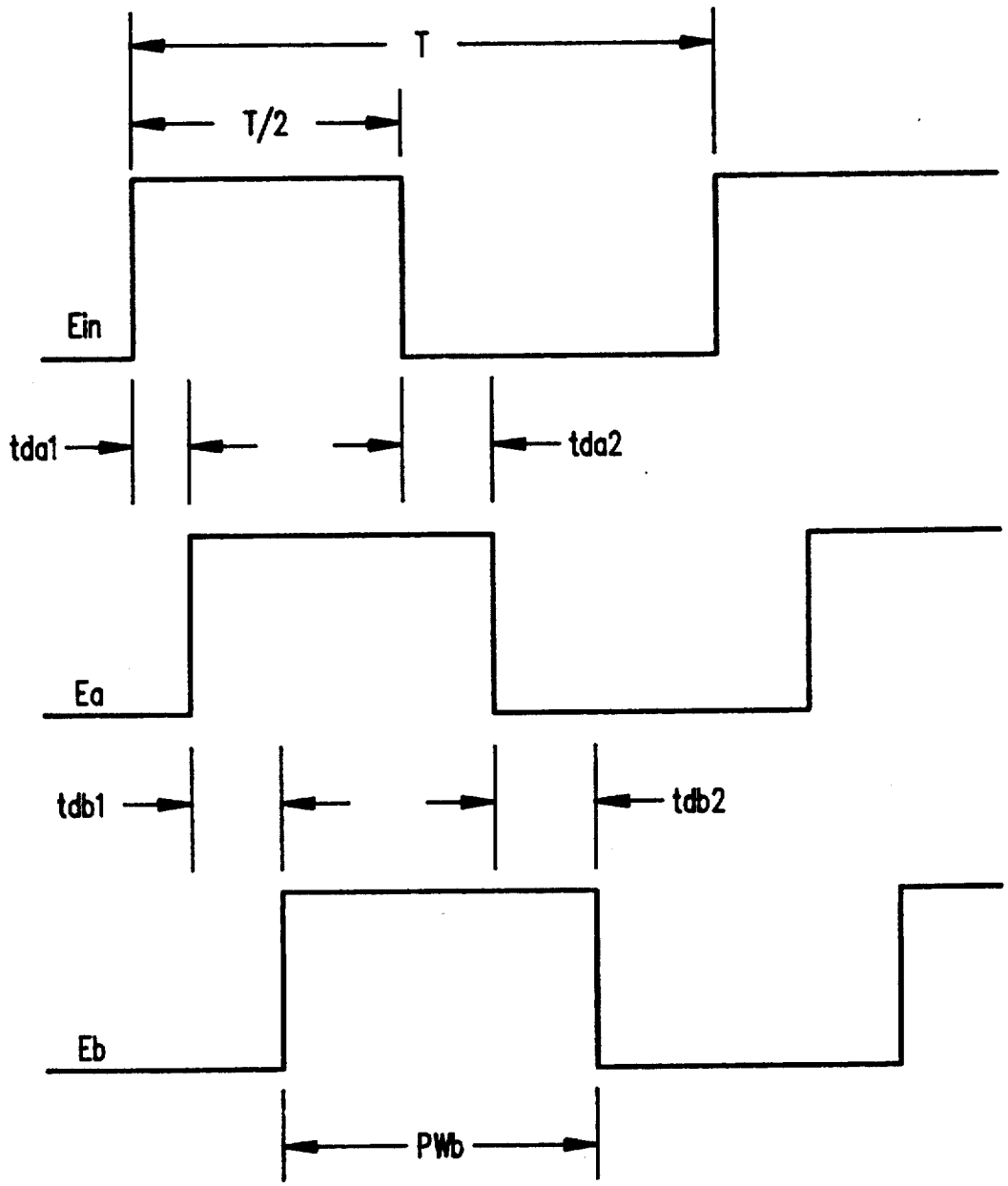
Figure 3:
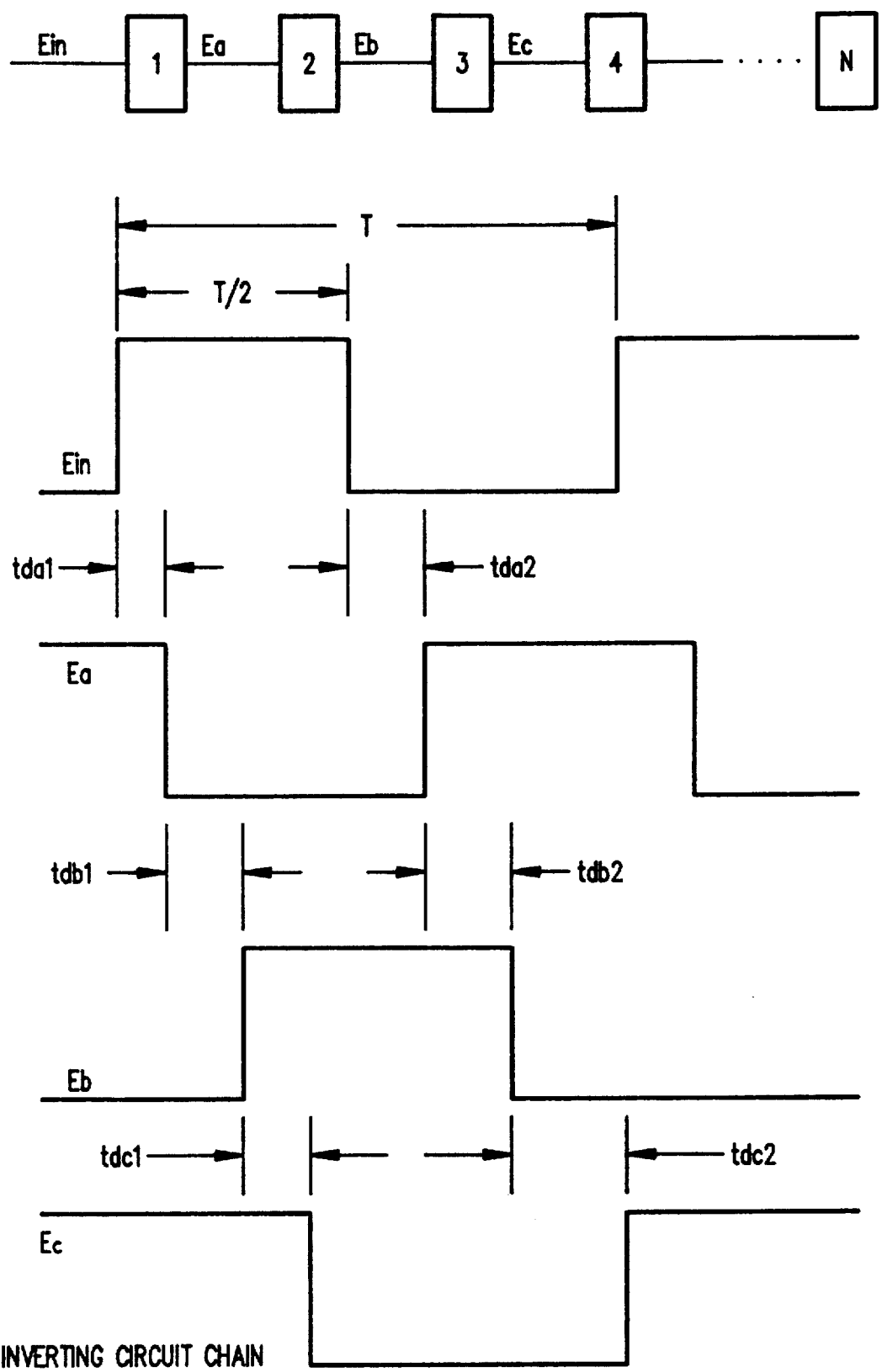
FIG. 3 is a block and timing diagram illustrating an inverting circuit chain and its pulse width distortion characteristics.

FIG. 2 illustrates a non-inverting circuit chain and its pulse width distortion characteristics at various points along the circuit chain. FIG. 3 provides similar illustration for an inverting circuit chain. As will be shown below, a circuit chain can have the effect of multiplying the single circuit distortion by the number of circuits in the chain; or, such a chain can have the effect of substantially eliminating the single circuit distortion.

For the noninverting circuit chain shown in FIG. 2 the pulse width at node b is $$PW_b = \frac{T}{2} + (t_{dd2} - t_{dd1}) + (t_{db2} - t_{db1}).$$

Making the assumption that the load $C_l$ on each stage is the same and that all stages are identical, the pulse width at node n is $$PW_n = \frac{T}{2} + n(t_{d2} - t_{d1}), \tag{6}$$

where $n = 1, 2, 3 \ldots N$.

In the same manner, for the chain of identical inverters shown in FIG. 3, the pulse width at node n is $$PW_n = \frac{T}{2} + \left[ \frac{1 + (-1)^{(n-1)}}{2} \right] (t_{d2} - t_{d1}), \tag{7}$$

where $n = 1, 2, 3 \ldots N$.

Notice that (6) and (7) have the same form except for the multiplier in front of the difference term $(t_{d2} - t_{d1})$. The term $$\left[ \frac{1 + (-1)^{(n-1)}}{2} \right]$$

has a value of one or zero for odd or even values of n respectively.

For noninverting and inverting circuit chains, PWD always results from the difference between the rise and fall delays of each circuit in the chain. As a pulse propagates through a chain of similar noninverting circuits, the distortion of the pulse continues to increase since the delay difference $(t_{d1} - t_{d2})$ is multiplied by the number of stages in the chain. This distortion may be reduced by either limiting the number of stages or minimizing the delay difference for each stage; however, it cannot be completely eliminated.

In contrast, a chain of similar inverting circuits provides distortion compensation as pulses propagate through the chain. In such a chain, the input pulse is restored after each inverter pair if every inverter in the chain is designed to maintain the same difference in rise and fall delay.

D. Pulse-Amplitude Distortion for an Inverter

Pulse-amplitude distortion occurs when a pulse at the output of a circuit does not have sufficient time to reach its final level before the next edge of the input pulse causes the output to change back to its original level. With specific reference to the circuit of FIG. 4, the minimum duration of the input pulse required to ensure pulse amplitude integrity at the output may be defined as $$T_{min} = MNP + MPP \tag{8}$$

In the case of the inverter of FIG. 1, equation (1) can be used to find the minimum negative pulse (MNP) and minimum positive pulse (MPP), provided the log (ln) term is changed to correspond to an output level of 2% and 98% of the final value, and $t_{d1}$ and $t_{d2}$ are replaced with MPP and MNP respectively. Solving for MPP from 50% of $V_{in}$ to 2% of $V_{dd}$ gives $$MPP = \frac{2C_{\beta ox} L_n}{K_{ox} \epsilon_0 U_n W_n} \left[ \frac{V_{tn}}{(V_{dd} - V_{tn})^2} + \frac{1}{2(V_{dd} - V_{tn})} \ln \frac{1.98 V_{dd} - 2V_{tn}}{0.02 V_{dd}} \right].$$

MNP will have the same form, with the subscript (n) replaced by the subscript (p). Again, the term in brackets can be rewritten as $$g(K_0) = \frac{1}{V_{dd}} \left[ \frac{K_0}{(1 - K_0)^2} + \frac{1}{2(1 - K_0)} \ln \frac{1.98 - 2K_0}{0.02} \right]. \tag{9}$$

The variation of $g(K_0)$ is about $\pm 3\%$ for $0.9V < V_{t0} < 1.1$ V with $V_{dd} = 5$ V.

Combining equations (8) and (9), the minimum input pulse period that can be propagated by the inverter is $$T_{min} = \frac{2C_{\beta ox} g(K_0)}{K_{ox} \epsilon_0 W_n} \left[ \frac{L_n}{U_n} + \frac{L_p}{\xi U_p} \right]. \tag{10}$$

The form of equation (10) is identical to equation (5) except for the plus sign and the replacement of $f(K_0)$ by $g(K_0)$. Thus, the dominant factors contributing to pulse amplitude degradation are the same as those that affect pulse width distortion.

E. Pulse Amplitude Distortion for any Circuit

Figure 4:
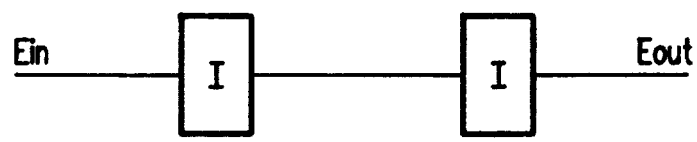
FIG. 4 is a block and timing diagram illustrating the relationship between input pulse width and output pulse integrity.
Figure 4:
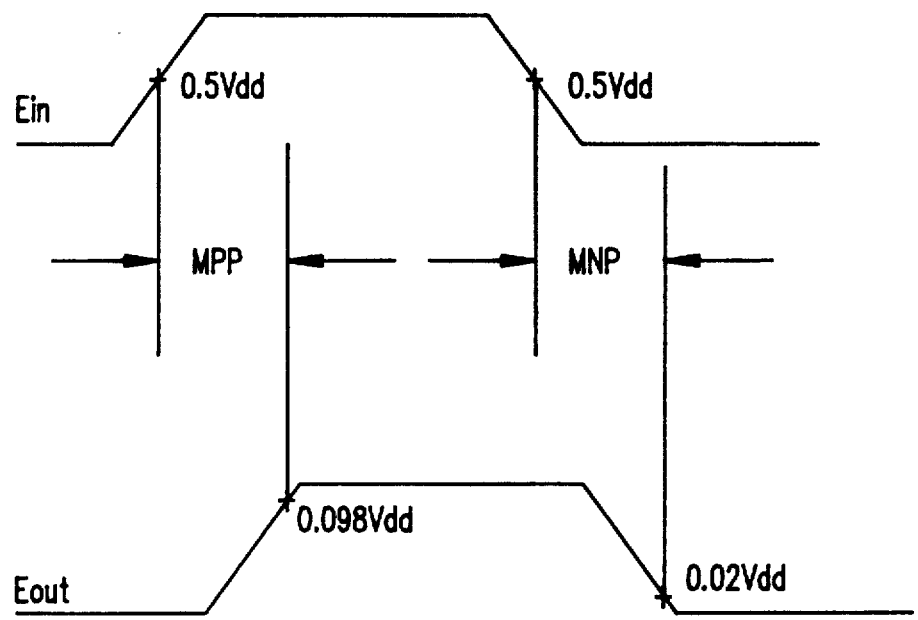
Figure 4:
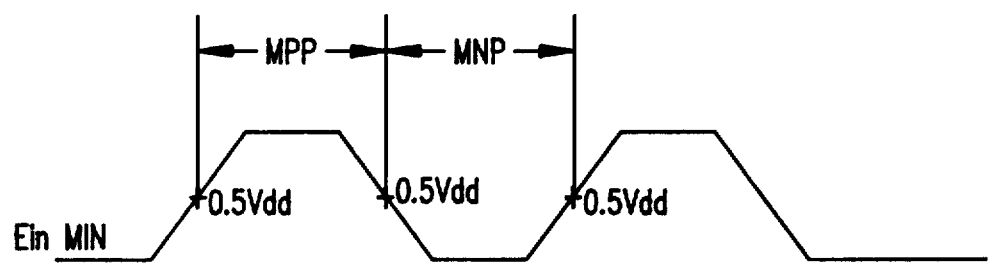

Reference is made again to FIG. 4, where there is shown a definition for the minimum positive and negative input pulse width required to maintain output pulse integrity, or rail-to-rail (RTR) output pulse amplitude. In the case where the circuit in FIG. 4 is composed of two CMOS inverters in series, the measurement points on $E_{in}$ of 0.5 $V_{dd}$ for the rising and falling edges are replaced with $K_1 V_{dd}$ and $K_2 V_{dd}$ respectively, and $K_1 V_{dd}$ and $K_2 V_{dd}$ are chosen approximately equal to $V_{tn}$ and $V_{tp}$ *of the input circuit N and P devices respectively, the circuit will just begin to change state as $E_{in}$* rises and falls through these levels. By choosing the 98% and 2% points on the rise and fall of $E_{out}$ respectively, the output is assured to have fully changed state. Under these conditions, the circuit will faithfully propagate the input voltage pulse if the width is greater than or equal to MPP and MNP.

The above values of $K_1$ and $K_2$ allow the output pulse to be at the rail for a short period of time before the output again changes state. However, it is to be noted that other K values may be appropriate. For instance, in the presence of light output loading, values of $0.1 < K_1 < 0.5$ and $0.5 < K_2 < 0.9$ can be used. Under these conditions the time required for the input voltage to reach 0.5 $V_{dd}$ will not be much greater than that required to reach 0.1 $V_{dd}$.

II. Generating Pulse Distortion Data

A. Pulse Width Distortion Characteristics for Unique Primary Logic Functions According to the present invention, a computer-implemented method measures pulse distortion characteristics for a VLSI circuit by determining the pulse distortion characteristics for each unique primary logic function contained in the VLSI circuit and then statistically summing those individual pulse distortion characteristics to reflect the contribution to the overall pulse distortion made by each occurrence of each primary logic function in the VLSI circuit. For each unique primary logic function, pulse distortion characteristics are determined as a function of design parameters, environmental parameters, and circuit process parameters. A matrix of pulse distortion data associated with various combinations of these parameters is developed, and arranged in tabular form. The method and data are executed from computer memory (e.g., RAM, ROM, disk, memory card) and intermediate results and tables are stored in computer memory.

In the preferred embodiment, pulse distortion data for a unique primary logic function is developed as a function of the dominant parameters contributing to pulse distortion, which were derived in Section (1) above. For circuitry designed in CMOS technology, these are (design parameters) capacitive loading and input rise/fall times, (environmental parameters) gate oxide thickness, temperature, and supply voltage, and (circuit process parameters) carrier mobility, effective channel length, and threshold voltage. More particularly, worst case environmental parameters are selected. Six separate combinations—representing three values of output capacitive loading and two values of input rise/fall time—are selected for the design parameters. The circuit process parameters are modelled as Gaussian statistical distributions. (This approximation is based on existing process data found to assume the form of a Gaussian function.)

It is additionally to be recognized that even with respect to a unique primary logic function, circuit parameters other than those discussed above may affect pulse distortion. For instance, a circuit may contain several power levels, and specific instances of a primary logic function may be driven at different power levels from one another. In this case, the specific circuit implementation of the primary logic function will be different for each power level. Thus, the distortion characteristics for the primary logic function will vary for different power levels. Also, for primary logic functions with multiple input or output pins, each pin pair may have different pulse distortion characteristics. In recognition of these additional variables, pulse distortion data is developed for all the above-described combinations of design, environmental, and process parameters at each power level applicable to a particular primary logic function, and further for each input/output pin pair associated with the primary logic function.

Having chosen a set of parameters for application to the primary logic function of interest, pulse distortion is measured using any analog circuit simulation tool. Commercially available examples include SPICE and ASTAP. According to the method of the present invention, a sample pulse is applied to the analog tool, and a number of iterations are run under program control in order to develop a Gaussian distribution. Endpoint statistical analysis is performed, also under program control, so that the curve may be represented by its effective endpoints. In the preferred embodiment, a $3\sigma$ distribution (that is, having a minimum point at $-3\sigma$ and a maximum point at $+3\sigma$), requiring 200 iterations, is used. The result is positive or negative values representing the minimum $(-3\sigma)$ and maximum $(+3\sigma)$ expansion or shrinkage of a pulse from the input to the output of the primary logic function. These values are stored in computer memory for assembly into tabular form.

With respect to generating pulse distortion data, it is to be noted that many variations on the above-described preferred embodiments are possible. For instance, depending on the technology (e.g., NMOS, Bipolar, etc.), different circuit process parameters may be selected as affecting pulse distortion and these parameters may be represented by other than a Gaussian distribution. Or, rather than selecting worst case values for environmental parameters, it may be decided to use only nominal values. Further, greater or lesser numbers of design parameter combinations may be chosen, depending on the design point and the precision required in the final pulse distortion analysis result. As for the statistical analysis technique used to generate the pulse distortion values, alternatives to end point analysis are available, including full statistical analysis. Also, alternative $\sigma$ values may be used (e.g., $6\sigma$). Or, alternative numbers of iterations may be used; for instance, if full statistical analysis is used, at least 5000 iterations may be required for each set of parameters.

B. Pulse Amplitude Distortion Characteristics for Unique Circuit Types

Once pulse width distortion values have been generated for a given set of parameters applied to a primary logic function, the same analog simulation results used to create these values are used to determine the primary logic function's pulse amplitude distortion characteristics, particularly the minimum pulse width required to guarantee full pulse amplitude propagation (known as rail-to-rail or RTR output).

However, unlike with pulse width distortion distributions, to determine minimum pulse widths, the pulse polarity must be considered. This is because the primary logic function will propagate different minimum pulses for positive and negative polarity. Thus, according to the present invention, four different scenarios must be accounted for: a positive pulse input to a noninverting logic function; a negative pulse input to a noninverting logic function; a positive pulse input to an inverting logic function; and a negative pulse input to an inverting logic function. For all four scenarios, calculations are based on the results of the same analog simulation used to generate the pulse width distortion data. In the first scenario, the minimum pulse width is calculated as the time lapse from a low point on the input rising edge (leading edge) to a high point on the output rising edge (trailing edge)—10% and 98% are selected in the preferred embodiment. In the second scenario, the minimum pulse width is calculated as the time lapse from a high point on the input falling edge (leading edge) to a low point on the output falling edge (trailing edge)—90% and 2% are selected in the preferred embodiment. In the third scenario, the minimum pulse width is calculated as the time lapse from a low point on the input rising edge (leading edge) to a low point on the output falling edge (trailing edge)—10% and 2% are selected in the preferred embodiment. In the final scenario, the minimum pulse width is calculated as the time lapse from a high point on the input falling edge (leading edge) to a high point on the output rising edge (trailing edge)—90% and 98% are selected in the preferred embodiment.

Whatever scenarios apply to a given logic function, the result of the above calculations is a pair of values—one responsive to a positive input pulse, the other responsive to a negative input pulse—associated with a corresponding pulse width distortion value. The pair represents the minimum width a pulse must have at the input to the subject primary logic function in order to guarantee full amplitude propagation at the output of the primary logic function, and is stored in computer memory for assembly into tabular form. As discussed below, these minimum pulse width values may be used to perform a rail-to-rail check at each primary logic function occurrence in a complex electronic circuit design and thereby identify and eliminate pulse propagation failures.

It is to be noted that the preferred embodiment threshold values were calculated to provide a conservative RTR check, in effect guaranteeing pulse propagation for the technology used in the preferred embodiment. Other threshold values could be calculated, depending on the level of conservatism required and the technology at issue. For instance, in the first scenario, the minimum pulse width could be calculated as the time lapse from the 10% point on the input rising edge to the 90% point on the output rising edge.

C. Exemplary Pulse Distortion Table for a Primary Logic Function

According to the preferred embodiment of the present invention, FIG. 5 is a pulse distortion table for a typical primary logic function designed in CMOS technology. Such a table is stored in computer memory accessible to the digital computer creating or using it. The table is constructed using positive input pulses 20 ns wide. The variables shown are load capacitance (Cl), rise/fall times ($T_r/T_f$), output pulse distortion, and minimum positive and negative input pulse width required to guarantee rail-to-rail output. Cl is in picofarads, and the $T_r/T_f$ values are in nanoseconds. The minimum, nominal, and maximum value columns across the table correspond to the results of the endpoint statistical analysis performed on the circuit simulator results, where "min" and "max" are the $-3\sigma$ and $+3\sigma$ points of a Gaussian curve distribution, respectively. All values shown in the table are rounded to three decimal places, which represent the significance limit of the information contained there.

Figure 6:
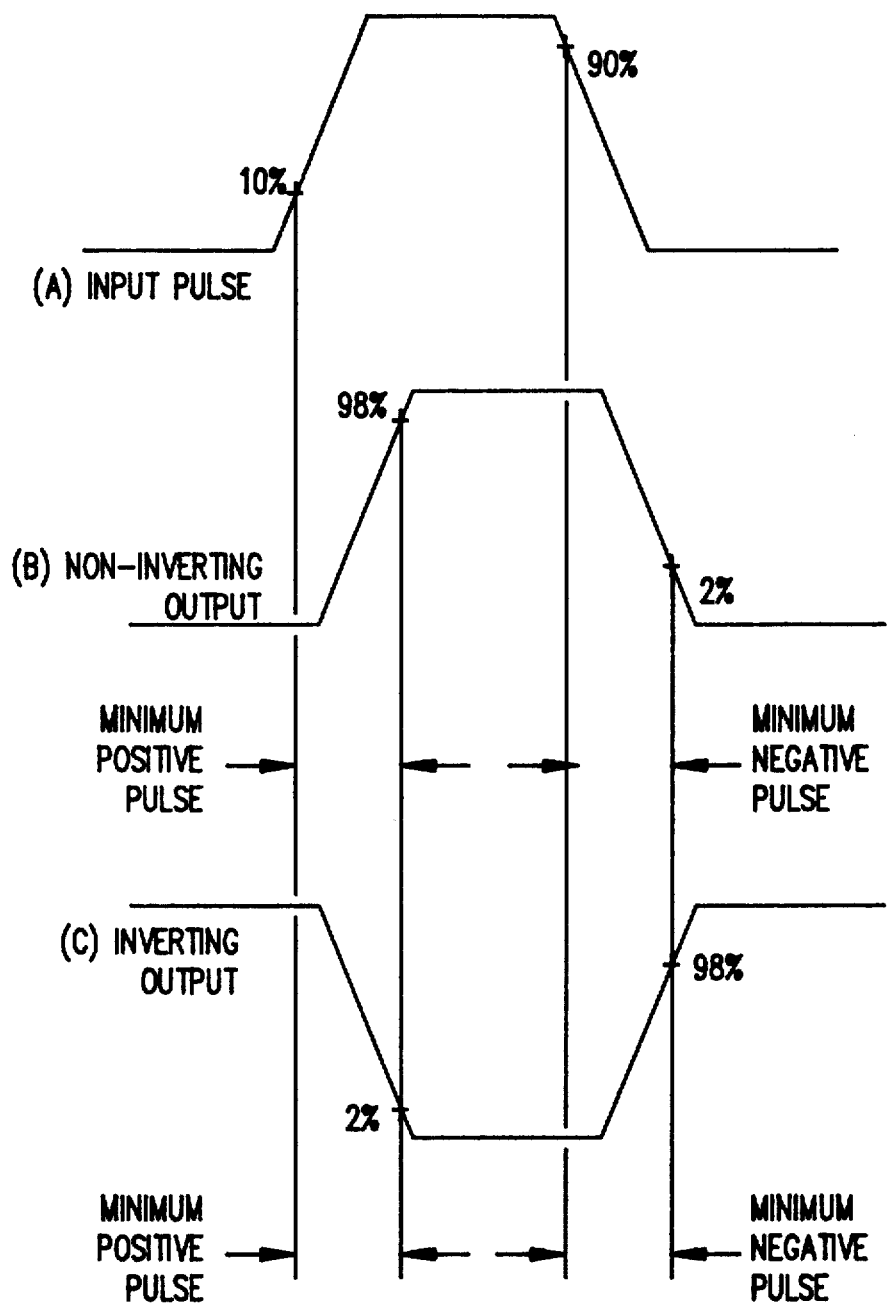
FIG. 6 is a timing diagram illustrating the characteristics of the minimum positive and negative input pulses required to guarantee rail-to-rail output.

The "Distortion" columns contain values representing the amount of change, in nanoseconds (ns), in the output pulse width for a positive pulse at the input of the subject primary logic function, with the specified Cl and $T_r/T_f$, and measured at the 50% to 50% amplitude points. The distortion values are calculated such that they represent the maximum distortion for a given combination of Cl and $T_r/T_f$. For CMOS, the environmental conditions under which this occurs are $T=70$ C, $V_{dd}=4.75$, and $T_{ox}=2.2$. The "Minimum Positive Pulse" columns contain values representing the estimated minimum positive pulse width required at the input to the primary logic function to guarantee a rail-to-rail output pulse. As shown in FIG. 6, for a noninverting output this value is measured from the 10% point on the input rising edge of a positive pulse to the 98% point on the output rising edge. For an inverting output it is measured from the 10% point on the input rising edge of a positive pulse to the 2% point on the output falling edge. The "Minimum Negative Input Pulse" columns contain values representing the estimated minimum negative pulse width required at the input to the primary logic function to guarantee a rail-to-rail output pulse. As shown in FIG. 6 for a noninverting output this value is measured from the 90% point on the input falling edge of a positive input pulse to the 2% point on the output falling edge. For an inverting output it is measured from the 90% point on the input falling edge of a positive input pulse to the 98% point on the output rising edge.

D. Using Pulse Distortion Tables

Figure 7:
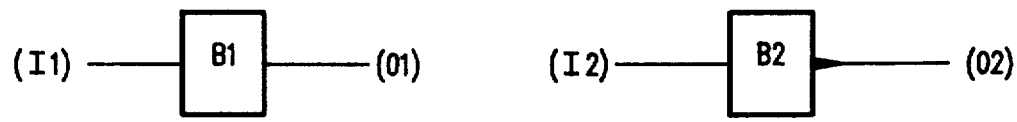
FIG. 7 is a block and timing diagram illustrating the use of a pulse distortion table to estimate pulse distortion through a primary logic function.
Figure 7:
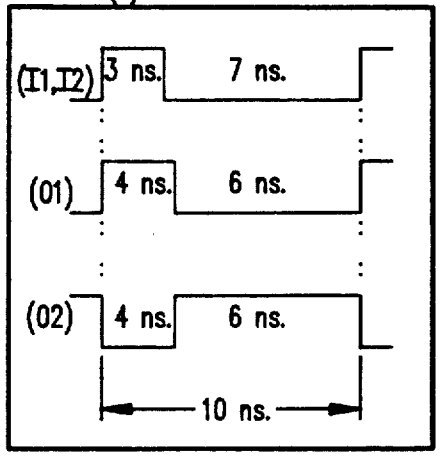
Figure 7:
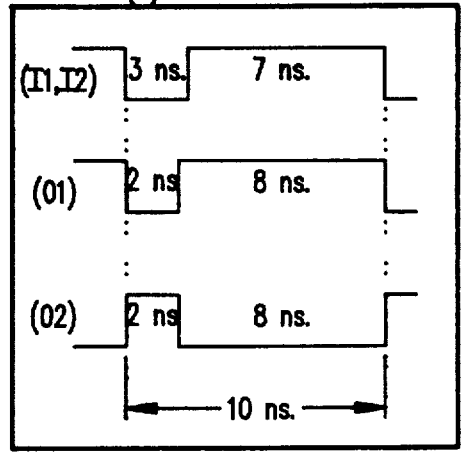

Shown in FIG. 7, case (1), is a design pulse consisting of a positive 3 ns input pulse with a 10 ns period. Since there is a 3 ns positive input pulse, the remaining part of the 10 ns is a 7 ns negative input pulse. If the relevant pulse distortion table shows a +1 ns distortion for the primary logic function, output (O1) will be a 4 ns positive pulse followed by a 6 ns negative pulse. Output (O2) for primary logic function B1 is the response for inverting logic to the same 3 ns positive input pulse. Of course, the above analysis omits overall circuit delays.

Shown in FIG. 7, case (2), is a design pulse consisting of a negative 3 ns input pulse with a 10 ns period. If the relevant pulse distortion table shows a +1 ns distortion, the 7 ns positive input pulse will grow to 8 ns when propagating through primary logic functions B2, while the negative 3 ns input pulse will shrink to 2 ns. The case for inverting negative logic is shown for primary logic function B2 in case (2), Output (O2). Once again, it is to be noted that the above analysis omits overall circuit delays.

As the above examples illustrate, for a positive input pulse to a given primary logic function, the output pulse distortion is read directly from the table. For a negative input pulse, the output pulse distortion is the table value with the sign changed.

III. Determining Pulse Distortion for a Logic Block

A logic block is made up of instances (occurrences) of primary logic functions connected together. The pulse distortion along a path through a logic block accumulates as the pulse passes from one primary logic function to another; this cumulative pulse distortion is a function of the individual distortions associated with the various primary logic function occurrences along the path.

According to the method of the present invention, a logic block is analyzed for pulse width distortion characteristics by applying a design pulse to the logic block, following each path through the logic block from its input to its output, and statistically summing the individual pulse width distortions associated with each primary logic function occurrence along the path. Only one input pin is tested at a time; all others are assigned logic values so that the design pulse propagates along the desired path. To compensate for variations in the pulse width distortion characteristics of primary logic functions caused by input/output interaction with other primary logic functions, a correlation coefficient is combined with the pulse width distortion attributed to each primary logic function occurrence along the path. As the pulse width analysis progresses along a path, a rail-to-rail check is performed at each primary logic function occurrence to determine whether the propagated state of the design pulse (i.e. the pulse width) at the input to the primary logic function is sufficient to guarantee full pulse amplitude propagation at the output.

A Statistical Method

A pulse being propagated along a particular path is distorted by each logic function in that path. The pulse width distortion caused by each logic function varies statistically with the parameters contributing to the distortion. Thus, the cumulative pulse width distortion along a path is represented by the statistical sum of the individual pulse distortions. In mathematical terms, the statistical summation of any random variables is the convolution of those variables. The theories and processes of statistical summation and convolution are well known in mathematics, and therefore will not be discussed in detail here.

In the preferred embodiment of the invention, the statistical variation of pulse distortion is modelled by a Gaussian process. A gaussian distribution is completely defined by a mean ($\mu$) and a standard deviation ($\sigma$) so pulse distortion for each primary logic function in a path may be represented by a $\mu$ value and a $\sigma$ value. Since each primary logic function contributes to the total pulse distortion in a path, the cumulative distribution for the path, defined by ($\mu_{path}$, $\sigma_{path}$), describes the total pulse width distortion. Mathematically, this is expressed as:

$$\mu_{path} = \sum_{i=1}^{n} \mu_i \tag{11}$$

and $$\sigma_{path}^2 = \sum_{i=1}^{n} \sum_{j=1}^{n} \rho_{ij}\sigma_i\sigma_j \tag{12}$$

where $\rho_{ij}$ are correlation coefficients used to compensate for variations in pulse distortion characteristics that occur when isolated primary logic functions are electrically connected to one another. Thus, for a path having n blocks represented by Gaussian distributions, equations (11) and (12) are used to determine the total distortion along the path.

A correlation coefficient, $\rho$, in general is a measure of the dependence between two variables, and can assume values such that $-1 \leq \rho \leq 1$. A value of $\rho = 1$ indicates that two variables are completely correlated (completely dependent) and a value of $\rho = 0$ indicates that two variables are completely uncorrelated (completely independent). A variable is completely correlated with itself; thus, $\rho_{ii} = \rho_{jj} = 1$.

Figure 8:
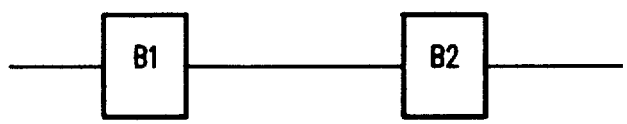
FIG. 8 is a block diagram illustrating a path through the logic block.

For purposes of the present invention, $\rho$ is a measure of pulse distortion dependency between two primary logic functions in a path. FIG. 8 illustrates such a path, consisting of connected primary logic functions B1 and B2. Variables associated with B1 and B2 use 1 and 2 as subscripts, respectively.

If B1 and B2 are two distinct primary logic functions in a path, where B1 and B2 are dependent, then equation (12) can be expanded to the following:

$$\sigma_{path}^2 = \sigma_1^2 + \sigma_2^2 + 2\rho_{12}\sigma_1\sigma_2 \tag{13}$$

where $\rho_{12} = \rho_{21}$ and $\rho_{11}\rho_{22} = 1$

Equation (13) can be generalized for n primary logic functions in a path:

$$\sigma_{path}^2 = \sum_{i=1}^{n} \sigma_i^2 + 2\left(\sum_{i=1}^{n-1} \sum_{j=i+1}^{n} \rho_{ij}\sigma_i\sigma_j\right) \tag{14}$$

where $\rho_{ij} = \rho_{ji}$ and $\rho_{ii} = \rho_{jj} = 1$

If each primary logic function in the path has the same correlation coefficient associated with it, then the above holds for each primary logic function and equation (12) becomes $$\sigma_{path}^2 = \rho\left(\sum_{i=1}^{n} \sum_{j=1}^{n} \sigma_i\sigma_j\right) \tag{15}$$

If B1 and B2 are two distinct primary logic functions in a path, where B1 and B2 have no dependencies, then $\rho_{12} = 0$ and equation (12) simplifies to the following:

$$\sigma_{path}^2 = \sigma_1^2 + \sigma_2^2 \tag{16}$$

For a path of n primary logic functions, this equation takes the general form:

$$\sigma_{path}^2 = \sum_{i=1}^{n} \sigma_i^2 \tag{17}$$

To summarize, equations (11) and (12) represent the general form for cumulative PWD expressed as a Gaussian distribution. Under the conditions noted above, (12) can be expressed as (14), which can be reduced to equation (15) by specifying a single correlation coefficient such that $\rho \neq 0$, or to equation (17) by specifying a single correlation coefficient such that $\rho = 0$.

In general, where $\rho$ is specified to be nonzero, it may be determined for a given interconnection of primary logic functions by applying a design pulse and comparing the pulse width distortion of an actual hardware implementation or analog simulation with the result achieved using the statistical approximation method of the present invention. In the preferred embodiment, $\rho$ is specified to be a nonzero value, and is determined by curve fitting graphs of pulse width distortion calculated using the statistical method of the present invention with graphs of pulse width distortion generated using an analog circuit simulator. This process is applied to selected logic blocks consisting of various interconnections (couplings) of primary logic functions. The result is a set of correlation coefficients, each coefficient applicable to a particular coupling of primary logic functions. These coefficients are stored in computer memory for reference when determining the cumulative PWD along a logic path.

It is to be noted that actual determination of coefficients for a sample set of logic blocks implemented in CMOS technology has yielded identical values for all logic blocks in the sample. Of course, this cannot be expected to hold for all technologies and all logic families; therefore, the preferred embodiment contemplates distinct values of correlation coefficients for every interconnection of primary logic functions.

It is also worth of note that, while the preferred embodiment representation of cumulative pulse width distortion is a Gaussian distribution, other statistical distributions may be used. In certain scenarios, these may provide a more accurate model for the actual distribution. However, in most cases the mathematical processes required to sum the individual distributions become considerably more complex than with Gaussian distributions.

IV. Application of the Invention to a Typical Logic Path

A. Pulse Width Distortion Calculations

Figure 9:
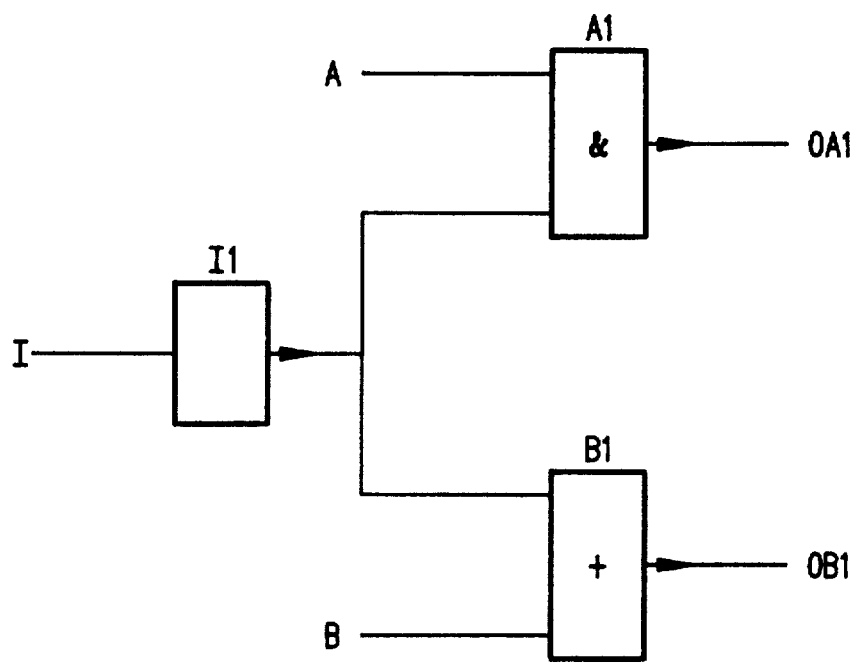
FIG. 9 is a block diagram illustrating a logic block which contains multiple logic paths.

A small, but typical, piece of logic is shown in FIG. 9. A single inverter (I1) (with fanout=2) is driving a single input to a NAND gate (A1) and a single input to a NOR gate (B1). (The second inputs of A1 and B1, A and B, respectively, are being driven by a path or paths which are not shown in the diagram). Thus, two distinct paths are shown: (1) <I1,A1> and (2) <I1,B1>. It is to be noted that these separate paths may continue further or branch out into other paths; however, these two short paths are sufficient for exemplary purposes.

The statistical algorithm described in Section III is independent of the logical operations performed by primary logic functions, so as a pulse is propagated along a path, no knowledge of the logical operations taking place in that path is needed. According to the method of the present invention, only one input pin per primary logic function is stimulated at a time; the other input pins are tied to a logic 0 or 1 to allow the pulse on the stimulated pin to produce a stimulus on the output pin of the selected path.

If a primary logic function has multiple input and/or output pins, they will each distort a pulse differently. Even the most balanced input pin configurations will have different distortion characteristics. Thus, a separate pulse distortion table for each input/output pin pair in a primary logic function yields the highest accuracy.

Determining the pulse distortion characteristics for the circuit shown in FIG. 9 thus requires one table for primary logic function I1 (inverter) and two tables each for primary logic functions A1 and B1 (2 input NAND gate and 2 input NOR gate).

Following the <I1,A1> path in FIG. 9 requires accessing two separate distortion tables. Using FIG. 5 as an example table, the method of the present invention calculates distortion through I1 by determining the distortion means and standard deviation for that primary logic function based upon the capacitive load at its output and the input rise or fall time of the pulse at its input. The input rise and fall times of the input pulse (at I) are technology specific and are determined by means well known in the art. They are stored in computer memory and supplied to the present invention as parameters. The capacitance at the output of each primary logic function is either estimated using an estimated value for the wiring capacitance plus the actual value of the input pin capacitance for the primary logic function(s) which constitute the load at the output or can be extracted from a post physical design capacitance file. Both these approaches are well known in the art. The values they yield are stored in computer memory and supplied to the present invention as parameters. Given these values, the distortion is determined using the distribution in the table. Interpolation is required if the capacitive loading and/or the input rise or fall time lies between the values given in the table. Extrapolation may be used if values lie outside the values given in the table.

Specifically, the means distortion and standard deviation for the primary logic function represented by FIG. 5 are calculated by the method of the present invention from the pulse distortion table according to the following equations:

$$\mu = (\delta_{min} + \delta_{max})/2 \qquad (18)$$

$$\sigma = (\delta_{max} - \delta_{min})/6 \qquad (19)$$

$\delta_{min}$ and $\delta_{max}$ are the minimum and maximum distortion values shown in FIG. 5 for a given output capacitive load and input pulse rise or fall time. Thus, if the table in FIG. 5 is used to represent the distortion characteristics of primary logic function I1, and I1 has an output capacitive load of 0.1 pF and an input rise time of 0.5 ns., the distortion through I1 is represented by $(\mu_{I1}, \sigma_{I1})$, which according to equations (18) and (19) is calculated to be $(-0.1795, 0.0322)$. Since the input pulse has thus far only propagated through the first primary logic function in the path, the correlation coefficient does not yet come into play. If the input design pulse is a 1-level having a duration of 5.0 ns., then the mean output pulse at I1 is 4.8205 ns. The variation in the pulse width is determined according to the number of standard deviations, $\sigma$, specified on the Gaussian curve. For three standard deviations, or $3\sigma$, then the distorted output pulse at I1 will lie within the the range of 4.8205 ns $+/- 0.0966$. Of course, any standard deviation may be used.

The mean and standard deviation calculations for primary logic function A1 are performed in the same way. However, the distortion calculations for the path become more complicated, since there are now two primary logic functions in the path. The correlation coefficient for I1 and A1 is used to calculate the standard deviation, $\sigma_{path}$, according to equation (13). The means is calculated according to equation (11). Thus if the distortion for primary logic function A1 is calculated from the tables as (mean$_{A1}$,$\sigma_{A1}$)=(0.1,0.02), and the correlation coefficient is known to be $\rho_{I1,A1}$=0.1, then the distortion for the path (at OA1) is (mean$_{path}$,$\sigma_{path}$)=(−0.0795,0.0396). Since primary logic function A1 is inverting, the pulse will once again be at the 1-level and the mean value of the pulse will be 4.9205. For a 3$\sigma$ variation, the pulse will lie somewhere in the range 4.9205 +/−0.1188.

The above-described process is repeated to calculate the distortion in path <I1,B1> in FIG. 9. If the paths were to continue through more primary logic functions, the same process would be used, except with the generalized forms of the equations for calculating the path means and standard deviation.

B. Rail-to-Rail Check

The statistical algorithm is used to calculate the pulse distortion through a path. However, it does not guarantee that the amplitude of a pulse propagated along the path (that is, its propagated state at each primary logic function) remains at sufficient levels such that it continues to be propagated through each primary logic function. In order to guarantee the continued propagation of any pulse in a path it is necessary to check that it has met the minimum pulse width required at the input to each primary logic function such that rail-to-rail output will be achieved.

Since pulse amplitude is not a parameter that is propagated along a path, the relationship between pulse amplitude and pulse width is used to perform the rail-to-rail check. Each pulse distortion table contains a distribution for the minimum input pulse width to guarantee a rail-to-rail output. The values are stored in the tables based upon capacitive loading and input rise/fall times. Interpolation is required if the capacitive loading or the input rise or fall time lies between the values given in the table. Extrapolation is necessary if the time lies outside the values in the table.

Referring again to the circuit shown in FIG. 9 and the exemplary values given in FIG. 5, the propagated state of the design pulse at the output of primary logic function I1 was calculated in (A) above to be 4.8205 ns. +/−0.0966. This is also the pulse width at the input to primary logic functions A1 and B1. If the pulse is again followed through A1, according to the method of the present invention the rail-to-rail check is performed by accessing the pulse distortion table (by pin) for A1 and looking up the values of minimum negative input pulse for the calculated capacitive load and input rise or fall time. The minimum and maximum entries in the minimum positive pulse and minimum negative pulse columns of FIG. 5 represent the 3$\sigma$ variation for the minimum input pulse width that will produce a rail-to-rail pulse at the output. If the minimum and maximum entries found in the minimum negative pulse width column are 1.600 and 1.800, for instance by comparing these to the minimum and maximum values of the pulse width calculated at the input to the primary logic function (4.7239 and 4.9171), it can be observed that the rail-to-rail check will pass for the present example. On the other hand, if the entries found in the table were 1.200 and 1.800, the rail-to-rail check would fail.

V. Additional Applications for the Invention

The pulse distortion analysis methodology of the present invention is readily adapted to a variety of uses that are considered extensions to the basic process of determining cumulative pulse distortion and verifying rail-to-rail pulse propagation. These additional applications are therefore regarded as within the scope and spirit of the present invention.

A. Logic Simulation

The pulse distortion analysis methodology of the present invention is transparent vis-a-vis the logical operation performed by a primary logic function; it determines pulse distortion that occurs inherently in any logic design rather than distortion caused by logic structures. However, the invention is readily capable of integration with any logic simulation tool to provide a method for determining pulse distortion caused by logical operations.

B. Pin Droppable Inputs and Outputs

Some logic design methodologies and libraries allow input and/or output pins to be dropped from a primary logic function if they are not being used. The dropping of a pin from a primary logic function will change its distortion characteristics. Pin dropping may be taken into account in conjunction with the present invention by creating pulse distortion tables for all possible combinations of inputs and outputs for each primary logic function. Then, in order to recognize the pin configurations in the logic path, unique names may be assigned to every I/O pin configuration for each primary logic function.

C. Pulse Distortion Adjustment

Applied in in iterative fashion, the pulse distortion analysis methodology of the present invention provides a tool for manipulating pulse distortion for an entire circuit or at any intermediate point within a circuit. To use the invention as a pulse distortion adjustment tool, first an input pulse is defined. Then a margin is defined for the RTR check; the margin represents the amount the pulse must exceed the minimum RTR pulse duration. Next, two minimum pulse widths are defined, one applicable to the entire circuit, the other applicable to the inputs and outputs of the circuit. These minimum pulse widths cause warnings if their values are violated during analysis.

Once the values are chosen, the selected pulse is propagated through the chip and pulse distortion is characterized according to the present invention. Then the results are analyzed to detect propagation failures or warnings caused by violation of the RTR margin or minimum pulse widths defined above.

In response to any violations or warnings, the circuit design and/or the pulse is adjusted by one or more of the following techniques: lower the load capacitance; substitute an alternative primary logic function that achieves the same logical operation; implement an alternative design for the circuit; redefine the input pulse with a longer duration, steeper $T_r/T_f$, or both.

Finally, the new pulse is propagated through the new chip, and the analysis and adjustment steps are repeated. The above may be iterated until the desired pulse distortion characteristics are achieved.

D. Pulse Distortion Optimization

The concept of pulse distortion adjustment discussed in (D) above is extendable to achieve the minimum pulse distortion possible for a given circuit. The steps of (D) are repeated for various load capacitances, design alternatives, $T_r/T_f$, etc., and the results recorded, until an optimal value representing the bet overall combination of design parameter is attained.

While the invention has been particularly described and illustrated with reference to a preferred embodiment, it will be understood by those skilled in the art that changes in the description or illustrations may be made with respect to form or detail without departing from the scope of the invention. Accordingly, the present invention is to be considered as encompassing all modifications and variations coming within the scope defined by the following claims.

I claim:

1. A method for determining pulse distortion in a simulated logic block of a simulated electronic circuit design, comprising the steps of:
   segmenting the simulated logic block into simulated primary logic functions;
   determining a simulated pulse distortion described by pulse width, pulse amplitude, and pulse polarity for each of the simulated primary logic functions based on design parameters for the simulated primary logic functions by applying a simulated sample pulse described by a pulse width, pulse amplitude, and pulse polarity to each of the simulated primary logic functions for the design parameters;
   storing the determined distortion characteristic in computer memory; and
   determining cumulative distortion for each logic path through the simulated logic block by statistically summing the stored distortion characteristics for each of the simulated primary logic functions along the logic path, the statistical summation including a correlation coefficient which compensates for interactions between the simulated primary logic functions.

2. A method for measuring pulse distortion as recited in claim 1, wherein the simulated pulse distortion for each of the simulated primary logic functions is determined by providing values for design parameters to a circuit simulation tool to generate a pulse distortion value for the design parameters.

3. A method for measuring pulse distortion as recited in claim 2, wherein the statistical summing of the stored distortion characteristics includes compensating for interactions between the simulated primary logic functions in accordance with the correlation coefficients, and summing the compensated individual pulse distortion characteristics for each of the simulated primary logic functions along a logic path to determine a cumulative pulse distortion for the logic path.

4. A method for measuring pulse distortion as recited in claim 3, further comprising the step of:
   determining for each of the simulated primary logic functions and the design parameters, based on the simulated pulse distortion and the associated design parameters, a minimum pulse width value required to maintain pulse amplitude integrity.

5. A method for measuring pulse distortion as recited in claim 4, further comprising the steps of:
   applying a simulated design pulse to each logic path of the simulated logic block;
   for each occurrence of each of the simulated primary logic functions through the logic path from input to output, determining the propagated state of the simulated design pulse through the simulated primary logic function by statistically summing the pulse distortion characteristics of the simulated primary logic function with the propagated state of the simulated design pulse at an input of the simulated primary logic function, and determining pulse amplitude integrity of the simulated design pulse at an output of the simulated primary logic function by comparing the propagated state of the simulated design pulse at the input to the simulated primary logic function occurrence with the associated minimum pulse width value required to maintain pulse amplitude integrity.

6. A method for measuring pulse distortion in a simulated logic block of a simulated electronic circuit design, comprising the steps of:
   assigning statistical distributions for circuit process parameters associated with the simulated electronic circuit design;
   segmenting the simulated logic block into simulated primary logic functions;
   determining simulated pulse width distortion and pulse amplitude distortion characteristics of each simulated primary logic function for positive and negative pulse polarity based on the assigned statistical distributions, selected design parameters for the simulated primary logic function, and selected environmental parameters by applying a sample pulse to the simulated primary logic function;
   storing the simulated pulse width and pulse amplitude distortion characteristics in computer memory; and
   determining cumulative distortion for each logic path through the simulated logic block by statistically summing the distortion characteristics for each of the simulated primary logic functions along the logic path, the statistical summation including a correlation coefficient which compensates for interactions between the simulated primary logic functions.

7. A method for measuring pulse distortion as recited in claim 6, further including the step, prior to the first determining step, of:
   segmenting each of the simulated primary logic functions into combinations of input and output pins,
   and wherein the first determining step is repeated for each combination of input and output pins.

8. A method for measuring pulse distortion as recited in claim 7, wherein the pulse width and pulse amplitude distortion characteristics of each of the simulated primary logic functions are determined by
   applying values for the assigned statistical distributions, the selected design parameters, and the selected environmental parameters to a circuit simulation tool to generate a pulse width distortion value for the selected design parameters and environmental parameters;
   determining, as a function of each pulse width distortion value and the selected design parameters, a minimum pulse width value required to maintain pulse amplitude integrity.

9. A method for measuring pulse distortion as recited in claim 8, wherein the minimum pulse width value is determined by adding the pulse width distortion value to the time lapse between a specified point on a leading edge and a specified point on a trailing edge contiguous with the leading edge.

10. A method for measuring pulse distortion as recited in claim 9, wherein the selected design parameters include capacitive loading and input rise/fall times.

11. A method for measuring pulse distortion as recited in claim 10, wherein the selected environmental parameters include temperature and supply voltage.

12. A method for measuring pulse distortion as recited in claim 11, wherein the circuit process parameters include carrier mobility, effective channel length, and threshold voltage.

13. A method for measuring pulse distortion as recited in claim 12, wherein the statistical distributions are Gaussian distributions.

14. A method for measuring pulse distortion as recited in claim 6, wherein the statistical summation in the second determining step includes the substeps of:
 compensating for interactions between the simulated primary logic functions in accordance with the correlation coefficients; and
 summing the individual compensated pulse width distortion values for each of the simulated primary logic functions along the logic path to determine a cumulative pulse width distortion for the logic path.

15. A method for measuring pulse distortion as recited in claim 14, wherein the pulse width distortion values are mean values and the cumulative pulse width distortion is a mean value.

16. A method for measuring the pulse distortion as recited in claim 15, wherein
 the correlation coefficient relates the cumulative pulse width distortion for each of the simulated primary logic functions as determined by summing the individual pulse width distortion values for each of the simulated primary logic functions with the cumulative pulse width distortion for the coupled primary logic functions as determined by any of a circuit simulation tool and a circuit prototype, and wherein the statistical summation in the second determining step further includes the substep of summing standard deviation values for the individual pulse width distortion values, each adjusted in response to its corresponding correlation value, for each simulated circuit type along the logic path to determine a cumulative standard deviation for the logic path.

* * * * *

UNITED STATES PATENT AND TRADEMARK OFFICE
CERTIFICATE OF CORRECTION

PATENT NO. : 5,239,481　　　　　　　　　　　Page 1 of 2
DATED : August 24, 1993
INVENTOR(S) : Brooks et al.

It is certified that error appears in the above-indentified patent and that said Letters Patent is hereby corrected as shown below:

Column 4, line 8, delete whole line, insert--
$L_p, L_n$　Gate channel length in p- and n-channel transistors (μm)　--.

Column 4, line 13, delete whole line, insert--
$W_p, W_n$　Gate channel width in p- and n-channel transistors (μm)　--.

Column 4, line 16, delete whole line, insert--
$U_p, U_n$　Mobility of minority carriers in p- and n-channel transistors ($cm^2$/V-sec)

Column 4, line 62, delete whole line, insert-- $\dfrac{W_p}{W_n} = \dfrac{U_{n0}}{U_{p0}} = \zeta$ --.

UNITED STATES PATENT AND TRADEMARK OFFICE
CERTIFICATE OF CORRECTION

PATENT NO. : 5,239,481

DATED : August 24, 1993

INVENTOR(S) : Brooks et al.

Page 2 of 2

It is certified that error appears in the above-indentified patent and that said Letters Patent is hereby corrected as shown below:

Column 4, line 66, delete whole line, insert --
$$PWD = \frac{2C_i t_{ox} f(K_0)}{K_{ox} \varepsilon_0 W_n} \left[ \frac{L_n}{U_n} - \frac{L_p}{\zeta U_p} \right]$$
--.

Column 6, line 62, delete whole line, insert --
$$T_{min} = \frac{2C_i t_{ox} g(K_0)}{K_{ox} \varepsilon_0 W_n} \left[ \frac{L_n}{U_n} + \frac{L_p}{\zeta U_p} \right]$$
--.

Column 12, line 24, delete whole line, insert --
$$\sigma^2_{path} = \sigma^2_1 + \sigma^2_2 + 2\rho_{12}\sigma_1\sigma_2$$
--.

Column 12, line 30, delete whole line, insert --
$$\text{and } \rho_{11} = \rho_{22} = 1$$
--.

Column 12, line 55, delete whole line, insert --
$$\sigma^2_{path} = \sigma^2_1 + \sigma^2_2$$
--.

Signed and Sealed this

Fourteenth Day of March, 1995

Attest:

BRUCE LEHMAN

*Attesting Officer*   *Commissioner of Patents and Trademarks*